United States Patent [19] [11] 3,815,204
Feldman [45] June 11, 1974

[54] APPARATUS AND METHOD FOR SELECTIVELY BACKLIGHTING PRINTED CIRCUIT BOARD PERFORATIONS TO ACCURATELY LOCATE ELECTRICAL COMPONENT LEADS THEREIN

[76] Inventor: Gustav Feldman, 18 Prospect Ave., Bldg. C, Norwalk, Conn. 06851

[22] Filed: Feb. 26, 1973

[21] Appl. No.: 336,101

[52] U.S. Cl. .................... 29/203 B, 29/407, 29/626
[51] Int. Cl. ... H05k 13/04, B23q 17/00, H05k 3/30
[58] Field of Search ....... 29/203 B, 203 P, 407, 626

[56] References Cited

UNITED STATES PATENTS

| | | | |
|---|---|---|---|
| 2,959,848 | 11/1960 | Savitt | 29/407 |
| 3,216,101 | 11/1965 | Miller | 29/626 X |
| 3,372,455 | 3/1968 | Howie | 29/203 B |
| 3,621,554 | 11/1971 | Feldman et al. | 29/203 B |

*Primary Examiner*—Thomas H. Eager
*Attorney, Agent, or Firm*—Joseph L. Lazaroff

[57] ABSTRACT

A component locating apparatus, of the type arranged to selectively backlight different groups of component lead receiving perforations in a printed circuit board or harness wiring board, includes an improved backlighting apparatus with a multilayer board formed from a plurality of conductive layers, insulated from one another. A layer is provided for each group of perforations to be simultaneously backlighted, and the multilayer board has openings therethrough corresponding to and registerable with the perforations in the printed circuit board. Mounted in each opening is a light source element having an electrical contact arranged to contact the conductive layer which corresponds to the group of perforations which includes the perforation opposite that opening. A power source and switch complete a circuit through selected ones of the conductive layers and the light source elements in contact therewith, thus causing the light source elements to emit light and thereby backlight the respective groups of perforations.

The method of constructing such a backlighting apparatus entails assembling the multilayer board from a plurality of conductive layers insulated from one another, and then forming openings in said layers corresponding to and registerable with the perforations in the printed circuit board. The plurality of light source elements, each having an electrical contact arranged to contact a selected one of said conductive layers, are mounted in said openings so that the the appropriate conductive layer for the group including that opening is contacted. Finally, electrical circuit means are connected to said conductive layers to permit the light source elements to be energized to individually backlight the groups of the perforations.

11 Claims, 3 Drawing Figures

APPARATUS AND METHOD FOR SELECTIVELY BACKLIGHTING PRINTED CIRCUIT BOARD PERFORATIONS TO ACCURATELY LOCATE ELECTRICAL COMPONENT LEADS THEREIN

BACKGROUND OF THE INVENTION

1. Field of the Invention

This invention relates to component locating apparatus of the type arranged to selectively and sequentially backlight different groups of perforations in a perforated wiring board such as a printed circuit board.

Industrially, printed circuit boards used in electrical or electronic devices are duplicated in large numbers. Each printed circuit board generally receives a variety of electrical or electronic components, each of which may have a different number or different configuration of lead wires than the other components used in the same circuit. Each circuit board is provided with perforations to receive the lead wires of the various components. After passing through the circuit board, the lead wires are connected into the circuit printed or etched on the board (or the lead wires interconnected when the wiring board is of a type not having a circuit printed thereon). Since the different components are closely spaced on the printed circuit board, the openings for the lead wires are likewise closely spaced and present a confusing array that makes it a difficult and slow process, requiring great skill and knowledge on the part of the worker, to accurately set the components into the board with their lead wires extending through the perforations intended for them. Consequently, the assembly of components into printed circuit boards, in this fashion, is slow, tedious and error-ridden, and hence costly.

To counteract the problem of identifying the proper perforations to receive a component's lead wires, several arrangements have been devised which backlight selected groups of perforations in succession, so that a worker receives a clear visual indication isolating the specific perforations into which a component's lead wires are to be inserted. The present invention relates to an improved apparatus for backlighting a perforated wiring board, such as a printed circuit board, and to a method for constructing such a backlighting apparatus.

2. Description of the Prior Art

Arrangements for selectively backlighting different groups of perforations in a printed circuit board or other wiring board are disclosed in the following U.S. Pat. Nos.: Feldman, 3,621,554; Howie, 3,372,455; Miller, 3,216,101; and Savitt, 2,959,848. The Savitt patent discloses a device interposing, between a light source and a printed circuit board, a coded chart with visible code indicia aligning with selected perforations to indicate where electrical component lead wires are to be inserted. The Miller patent discloses a device interposing a perforated colored card between a light source and a printed circuit board so that selected perforations in the printed circuit board will appear colored. The Howie patent discloses another arrangement wherein several templates, corresponding in number to the different types of components to be inserted, are placed between a light source and a printed circuit board to register with particular perforations in the circuit board. The Feldman patent discloses an arrangement in which an opaque film, made into a series of templates by perforating different areas thereof, is fed successively across a printed circuit board into registration with selected perforations to illuminate them with a light source.

Each of the foregoing backlighting apparatuses involves the need to mechanically reposition a chart, template, card or film in order to highlight or illuminate a new group of perforations. Problems of inaccurate registration may occur, and mechanical movement, either automatic or manual, is necessary to change templates, resulting in added equipment cost or processing delays.

SUMMARY OF THE INVENTION

Objects of the present invention are to provide a component locating apparatus of the type arranged to selectively backlight different groups of perforations in a component mounting sheet, such as a printed circuit board, which includes a backlighting apparatus capable of selectively illuminating several different groups of perforations, which requires no mechanical repositioning in changing from one group to another, in which registration problems are reduced, which is easily constructed to serve a particular wiring board, and which permits quick, convenient use in a minimum of space.

According to the invention, the backlighting apparatus comprises a multilayer program board arranged to be placed next to the perforated component mounting sheet, the multilayer board having a plurality of conductive layers insulated from one another, each conductive layer corresponding to a single group of perforations to be simultaneously backlighted. A plurality of openings are formed in said conductive layers corresponding to and registerable with the perforations in the component mounting sheet. Mounted in each such opening is a light source element having means for electrically contacting the particular one of the conductive layers which corresponds to the group of perforations registering with that opening. Energizing means, such as a power source, switch, and edge connector, is provided for completing an electrical circuit through selected ones of the conductive layers and the light source elements in contact therewith, thereby to selectively energize the light source elements and to backlight the individual groups of perforations on the component mounting sheet to indicate where component lead wires are to be inserted. Changes in backlighting are effected electrically by changing the position of a switch and it is unnecessary to change the initial registration of the component mounting sheet with the multilayer program board.

The method of constructing the backlighting apparatus according to the invention comprises assembling a plurality of conductive layers insulated from one another, a conductive layer being provided to correspond to each group of perforations to be simultaneously backlighted. Openings are formed in the conductive layers in registration with the perforations in the component mounting sheet. Such openings can be formed, for example, with the same drilling apparatus used to drill the perforations in the component mounting sheet. A plurality of light source elements, having means for electrically contacting selected ones of the conductive layers, are mounted in the openings so that the conductive layer corresponding to the group of perforations registering with that opening is contacted. The backlighting apparatus is then connected to energizing means to complete an electrical circuit through selected ones of the conductive layers and the light sources in contact therewith.

Other objects, aspects and advantages of the invention will be pointed out in, or apparent from, the detailed description hereinbelow, considered together with the following drawings.

DESCRIPTION OF THE PREFERRED EMBODIMENT

Figures 1, 2, 3:
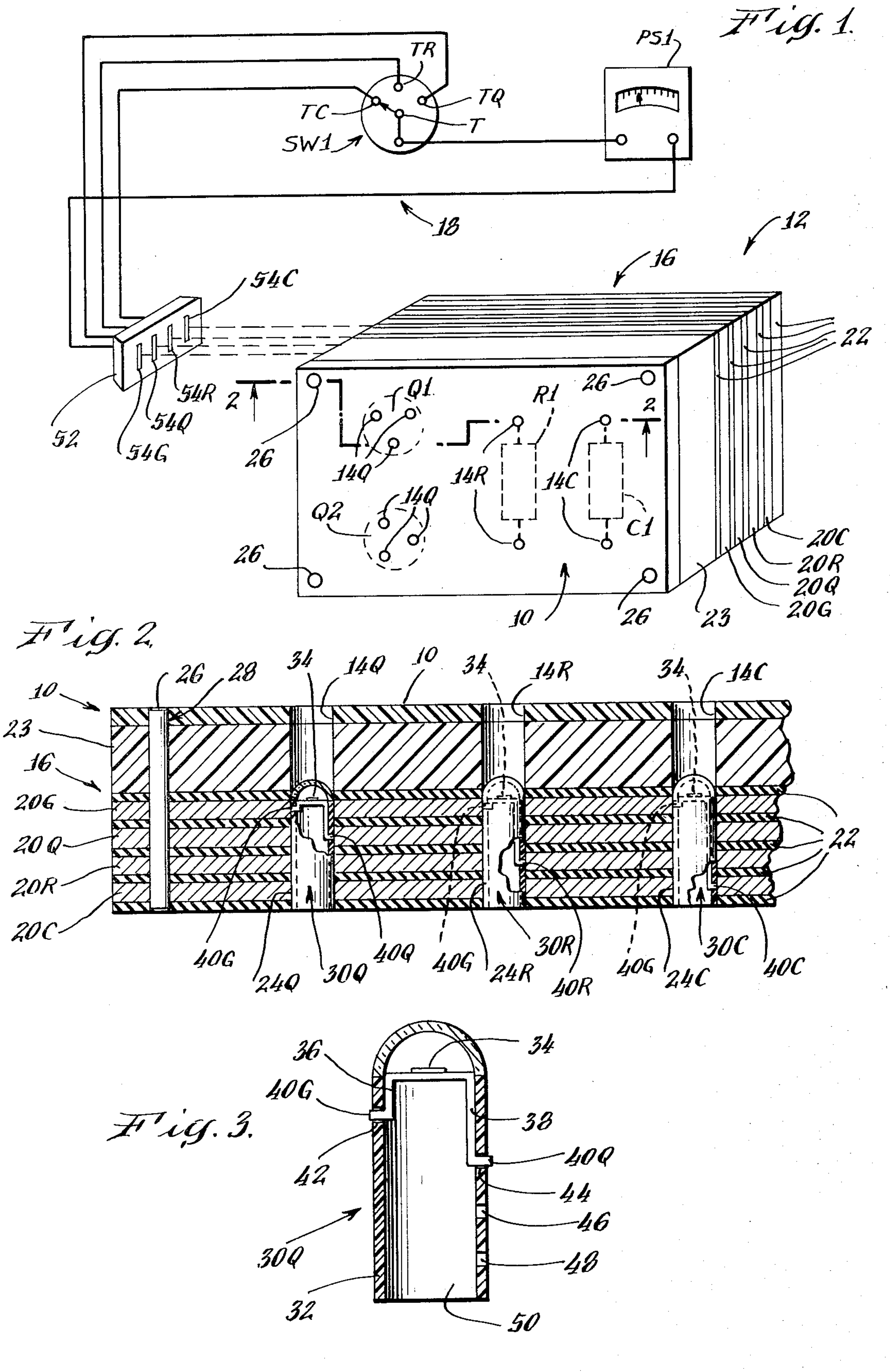
FIG. 1 is an essentially schematic perspective view of a backlighting apparatus according to the invention.
FIG. 2 is a section of line 2—2 of FIG. 1.
FIG. 3 is an enlarged sectional view of a light source element according to the invention.

FIG. 1 illustrates a printed circuit board 10 positioned for use with backlighting apparatus 12 constructed according to the present invention. The printed circuit board 10, like other wiring boards using backlighting techniques, is to have electrical components of different types wired into a circuit. For the purposes of illustration, it will be assumed that the printed circuit board 10 is to have three different types of components wired thereto: transistors Q1 and Q2, resistor R1, and capacitor C1.

In order to receive the lead wires from the components, the printed circuit board is provided with a group of perforations 14Q to receive transistor Q1 and Q2 lead wires, a group of perforations 14R to receive resistor R1 lead wires, and a group of perforations 14C to receive capacitor C1 lead wires. In order to mount components upon printed circuit board 10, without confusion of perforations, backlighting apparatus 12 is arranged as described below to selectively backlight these three different groups of perforations.

Backlighting apparatus 12 comprises a multilayer program board 16 (FIGS. 1 and 2) and an energization and switching circuit 18 (FIG. 1). The multilayer program board 16 is positioned adjacent to the printed circuit board 10 and comprises a plurality of layers 20G, 20Q, 20R and 20C of conductive material, such as copper sheet, preferably similar in size and outline to the printed circuit board 10. One conductive layer 20G is provided as a common or ground layer for a purpose to be described below, and the three conductive layers 20Q, 20R and 20C are provided to correspond one each to the three groups of perforations 14Q, 14R and 14C. As shown in FIGS. 1 and 2, conductive layers 20G, 20Q, 20R and 20C are insulated from one another, being separated from one another and from the printed circuit board 10 by insulating sheets 22. An opaque spacing sheet 23 separates the printed circuit board 10 from the top insulating sheet 22, and as will be explained below, provides a thickness for accommodating component lead wires inserted through perforations 14Q, 14R and 14C. If desired, spacing sheet 23 and the top insulating sheet 22 may be combined into a single unitary layer.

Multilayer program board 16, as shown in FIG. 2, has openings 24Q, 24R and 24C provided therein in correspondence to and in registration with the perforations 14Q, 14R and 14C in the printed circuit board 10. The openings 24Q, 24R and 24c may be easily provided by using the same drilling methods apparatus used to provide perforations 14Q, 14R and 14C in printed circuit board 10. Although shown in FIG. 2 as being the same cross-sectioned size, the openings in the multilayer program board 16 and the perforations in the printed circuit board 10 can be of different sizes so long as they register with one another and do not overlap with other perforations or openings associated with a different group.

The multilayer program board 16, as shown in FIGS. 1 and 2, carries suitably mounted locator pins 26 which are received in holes 28 in printed circuit board 10 in order to position the printed circuit board 10 with perforations 14Q, 14R and 14C in registry with openings 24Q, 24R and 24C.

Mounted in the openings 24Q, 24R and 24C are light source elements 30Q, 30R and 30C respectively. As shown in detail in FIG. 3, light source element 30Q comprises an outer tube 32 made, for example, of insulative rigid plastic, at the upper end of which is mounted a light source 34 having electrical leads 36 and 38 extending therefrom. The light source 34 may be an incandescent lamp, a neon lamp, a light emitting diode, or another device which emits visible radiation when energized. As will be explained below, the light sources 34 for different light source elements backlighting a single group of perforations (such as 30Q) or different groups may be arranged to emit different colors of light to distinguish perforations within a single group or among different groups.

As shown in FIG. 3, light source element 30Q has one lead 36 of its light source 34 terminate in a ground contact 40G which extends through an opening 42 in outer tube 32. The other lead 38 terminates in a contact 40Q extending through opening 44 in tube 32. Contacts 40G and 40Q are positioned along light source element 30Q so that, as illustrated in FIG. 2, contact 40G makes electrical contact with conductive layer 20G and contact 40Q makes electrical contact with contact layer 20Q.

Light source elements 30R and 30C are identical to light source elements 30Q, except that light source elements 30R have lead wire 38 terminate in a contact 40R positioned so as to contact conductive layer 20R, and light source elements 30C have lead wire 38 terminate in a contact 40C positioned to make electrical contact with conductive layer 20C. As shown in FIG. 3, tube 32 may be provided with additional openings 46 and 48 to accommodate contacts 40R and 40C in light source elements 30R and 30C respectively. The tubes 32 are the same length and are designed to be inserted with openings 24Q through 24C to the same depth, with contacts 40Q through 40C being automatically positioned at the correct height. The contacts 40G, 40Q, etc. are urged radially outwardly by the resilience of leads 36 and 38, and by a resilient filler 50 in tube 32, comprising, for example, silicon rubber. Accordingly, as a light source element (such as 30Q) is inserted into an opening (such as 24Q), the contacts 40G and 40Q will be resiliently urged against and make good electrical contact with the conductive layers 20G and 20Q.

An electrical circuit is completed independently through the three groups of light source elements 30Q, 30R, and 30C by means of energization and switching circuit 18, illustrated in FIG. 1. Circuit 18 comprises an edge connector 52 having contacts 54G through 54C for contacting conductive layers 20G through 20C respectively. A power source PS1 supplying electrical energy is connected in series between edge connector contact 54G and the common terminal T of a switch SW1 having alternately connectable terminals TQ, TR and TC connected respectively to edge connector contact 54Q, 54R, and 54C.

With energization and switching ciruit 18 connected as described, switch SW1 is able to connect power source PS1 between the ground conductive layer 20G and each of the remaining conductive layers 20Q, 20R and 20C. Hence an electrical circuit is completed independently through the light source elements 30Q, 30R and 30C to backlight independently the three groups of perforations 14Q, 14R and 14C in printed circuit board 10.

Where a single group of perforations, such as 14Q, is intended to receive more than one component, such as the two transistors Q1 and Q2, it may be desirable in some instances to differentiate between the different components by color coding the light sources 34 in the light source elements, such as 30Q, simultaneously backlighting the perforations in that group. For example, the light source elements 30Q backlighting the perforations for transistor Q1 could have red light sources 34, while the light source elements 30Q backlighting the perforations for transistor Q2 could have green light sources 34. By means of such color coding the number of different conductive layers 20G, etc., may be reduced.

It should be noted that while a specific example in which conductive layers providing three different selectable groups of backlighted perforations have been described, any number of different groups may be accommodated by supplying different numbers of conductive layers.

Construction of backlighting apparatus according to the present invention is both simple and rapid. It requires only that the conductive layers 20G through 20C be assembled with intervening insulating layers 22 into a multilayer board 16. The openings 24Q through 24C are formed in the layers by the same forming techniques used to provide perforations 14Q through 14C in the printed circuit board 10. Light source elements 30Q through 30C are inserted in the appropriate openings 24Q through 24C respectively, according to the arrangement of components on printed circuit board 10, and then edge connector 52 is attached to multilayer board 16. The simplicity of construction of the backlighting apparatus means that the cost providing for different printed circuit boards 10 is low, and hence the cost of wiring components to such printed circuit boards 10 is reduced.

The backlighting apparatus 12 of the present invention is used by an operator in the following manner. A printed circuit board 10 is placed on multilayer board 16, with locator pins 26 fitting in openings 28 to register perforations 14Q through 14C with openings 24Q through 24C. Switch SW1 selects one group of light source elements, such as 30Q, to be energized and thereby backlight one group of perforations, such as 14Q. If it is desired to differentiate perforations within a single group, the light source elements may be provided with different colored light sources as described above. The operator selects the appropriate components, such as transistors Q1 and Q2, and inserts their lead wires into the backlighted perforations. When no more backlighted perforations are visible, switch SW1 is advanced to complete a circuit through the next group of light source elements such as 30R to backlight the next group of perforations such as 14R and the appropriate component such as resistor R1 has its lead wires inserted into the backlighted perforations. In similar fashion, switch SW1 is advanced, the remaining groups of perforations are backlighted and the components are inserted. Throughout the entire process, printed circuit board 10 remains stationary, in registry with multilayer board 16, and the only action needed to change backlighting from one group of perforations to another is the advancing of switch SW1. Accordingly, backlighting transitions are made quickly and economically without need for the operator or mechanical elements to accurately position templates or masks.

Although specific embodiments or the invention have been disclosed herein in detail, it is to be understood that this is for the purpose of illustrating the invention, and should not be construed as necessarily limiting the scope of the invention, since it is apparent that many changes can be made to the disclosed structures by those skilled in the art to suit particular applications.

I claim:

1. A component locating apparatus of the type arranged to selectively backlight different components lead receiving perforations in a component mounting sheet, such as a printed circuit board, to indicate where component leads are to be inserted, characterized by a backlighting apparatus comprising:

a multilayer program board arranged to be placed alongside the component mounting sheet, said multilayer board having:
  a. a plurality of conductive layers insulated from one another, each separate group of perforations which is to be simultaneously backlighted corresponding to one of the conductive layers,
  b. a plurality of openings through said layers corresponding to and registerable with the perforations in said component mounting sheet which are to be backlighted, and
  c. mounted in each opening, a light source element having means for electrically contacting the one of said conductive layers corresponding to the group of perforations registering with that opening; and energizing means for completing an electrical circuit through selected ones of said conductive layers and the light source elements in contact therewith, thereby to selectively energize said light source elements and individually backlight said groups of perforations in the component mounting sheet.

2. A component locating apparatus of the type claimed in claim 1 wherein said component mounting sheet and said multilayer program board are interengaged for registry of said perforations and openings by means of locating pins mounted on said board and received in locating holes in said component mounting sheet.

3. A component locating apparatus of the type claimed in claim 1 wherein said multilayer program board comprises a conductive layer having said openings therein and acting as a common contact for said light source elements.

4. A component locating apparatus of the type claimed in claim 1 wherein said energizing means comprises a power source, connector means for engaging with each of said conductive layers, and switch means for selectively connecting said power source means through said connector means to a selected conductive layer.

5. A component locating apparatus of the type claimed in claim 3 wherein said energizing means further comprises a power source, connector means for connecting with each of said conductive layers, and switch means for selectively connecting said power source between said common conductive layer and the remaining conductive layers.

6. A component locating apparatus of the type claimed in claim 1 wherein said light source element comprises an insulative tube arranged to be received in said opening, a light source carried by said tube, said contacting means extending through said tube into electrical contact with the corresponding conductive layer.

7. A component locating apparatus of the type claimed in claim 6 wherein said multilayer program board comprises an additional conductive layer acting as a common connector for said light source elements, and wherein said light source element includes contact means extending through said tube for contacting said common conductive layer.

8. A component locating apparatus of the type claimed in claim 6 wherein said light source elements for backlighting different groups of perforations are of similar length and are arranged to be inserted uniformly in said openings, said contacting means being positioned to contact the corresponding conductive layers.

9. A component locating apparatus of the type claimed in claim 6 wherein said tube carries light source at one end thereof, said light source having leads extending through said tube and being resiliently urged outwardly.

10. A component locating apparatus of the type claimed in claim 1 wherein said light source elements simultaneously backlighting a single group of perforations have light sources emitting different colors of light to differentiate perforations within a single group.

11. A method for constructing a backlighting apparatus for a component locating apparatus of the type arranged to selectively backlight different component lead receiving perforations in a component mounting sheet, such as a printed circuit board, to indicate where component leads are to be located, said method comprising:

assembling a multilayer board from a plurality of conductive layers, insulated from one another, each group of perforations which is to be simultaneously backlighted corresponding to one of the conductive layers, forming openings in said layers corresponding to and registerable with the perforations in said component mounting sheet which are to be backlighted, providing a plurality of light source elements insertable in said openings and having means for electrically contacting selected ones of said conductive layers, inserting said light source elements into said openings with said electrical contact means contacting the one of said conductive layers corresponding to the group of perforations registering with that opening, and connecting to said conductive layers and energizing means for completing an electrical circuit through selected ones of said conductive layers and the light source elements in contact therewith.

* * * * *

UNITED STATES PATENT OFFICE
CERTIFICATE OF CORRECTION

Patent No. 3,815,204 Dated June 11, 1974

Inventor(s) GUSTAV FELDMAN

It is certified that error appears in the above-identified patent and that said Letters Patent are hereby corrected as shown below:

Column 6, line 27 reads:

ranged to selectively backlight different components

Should read:

ranged to selectively backlight different component

Column 8, line 33 reads:

and connecting to said conductive layers and ener-

Should read:

and connecting to said conductive layers an ener-

Signed and sealed this 26th day of November 1974.

(SEAL)
Attest:

McCOY M. GIBSON JR.
Attesting Officer

C. MARSHALL DANN
Commissioner of Patents